(12) United States Patent
Hale et al.

(10) Patent No.: US 6,407,929 B1
(45) Date of Patent: Jun. 18, 2002

(54) ELECTRONIC PACKAGE HAVING EMBEDDED CAPACITORS AND METHOD OF FABRICATION THEREFOR

(75) Inventors: Aaron Dean Hale, Chandler; Michael Walk; David G. Figueroa, both of Mesa; Joan K. Vrtis, Phoenix, all of AZ (US); Toshimi Kohmura, Ibaraki-ken (JP)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/606,882

(22) Filed: Jun. 29, 2000

(51) Int. Cl.[7] .................................................. H05K 1/18
(52) U.S. Cl. ..................... 361/763; 361/306.2; 361/760; 361/761; 361/782; 361/793; 257/724; 29/832
(58) Field of Search ............................... 361/306.2, 734, 361/738, 761–764, 780, 782, 792, 793–795, 760; 174/255, 260; 257/691, 700–703, 723, 724, 728; 333/247; 29/832

(56) References Cited

U.S. PATENT DOCUMENTS

| | | | | |
|---|---|---|---|---|
| 4,349,862 A | * | 9/1982 | Bajorek et al. ............. | 361/762 |
| 4,574,255 A | * | 3/1986 | Fujii et al. .................. | 361/795 |
| 5,708,570 A | * | 1/1998 | Polinski, Sr. ............... | 361/762 |
| 5,874,770 A | * | 2/1999 | Saia et al. .................. | 257/700 |
| 6,075,285 A | | 6/2000 | Taylor et al. ............... | 257/691 |
| 6,153,290 A | * | 11/2000 | Sunahara ..................... | 361/763 |

OTHER PUBLICATIONS

Cotton, M., "Microfeatures & Embedded Coaxial Technology", *Electronic Circuits World Convention 8*, 6 p., (Sep. 8, 1999).

* cited by examiner

Primary Examiner—Kamand Cuneo
Assistant Examiner—John B. Vigushin
(74) Attorney, Agent, or Firm—Schwegman, Lundberg, Woessner & Kluth, P.A.

(57) ABSTRACT

An electronic package (302, FIG. 3) includes one or more capacitors (308) embedded within one or more layers (310) of the package. The embedded capacitors are discrete devices, such as integrated circuit capacitors (FIGS. 17–18) or ceramic capacitors. During the package build-up process, the capacitors are mounted (410, FIG. 4) to a package layer, and a non-conductive layer is applied (412) over the capacitors. When the build-up process is completed, the capacitor's terminals (604, 608, FIG. 6) are electrically connected to the top surface of the package. The embedded capacitor structure can be used in an integrated circuit package (1904, FIG. 19), an interposer (1906), and/or a printed circuit board (1908).

29 Claims, 10 Drawing Sheets

ELECTRONIC PACKAGE HAVING EMBEDDED CAPACITORS AND METHOD OF FABRICATION THEREFOR

TECHNICAL FIELD OF THE INVENTION

The present invention relates generally to apparatus for providing capacitance to an electronic circuit, and more particularly to embedded capacitors in an integrated circuit package, and methods of capacitor and package fabrication.

BACKGROUND OF THE INVENTION

Electronic circuits, and particularly computer and instrumentation circuits, have in recent years become increasingly powerful and fast. As circuit frequencies continue to escalate, with their associated high frequency transients, noise in the power and ground lines increasingly becomes a problem. This noise can arise due to inductive and capacitive parasitics, for example, as is well known. To reduce such noise, capacitors known as decoupling capacitors are often used to provide a stable signal or stable supply of power to the circuitry.

Capacitors are further utilized to dampen power overshoot when an electronic device (e.g., a processor) is powered up, and to dampen power droop when the device begins using power. For example, a processor that begins performing a calculation may rapidly need more current than can be supplied by the on-chip capacitance. In order to provide such capacitance and to dampen the power droop associated with the increased load, off-chip capacitance should be available to respond to the current need within a sufficient amount of time. If insufficient voltage is available to the processor, or if the response time of the capacitance is too slow, the die voltage may collapse. The localized portions of a die that require large amounts of current in short periods of time are often referred to as die "hot spots."

Decoupling capacitors and capacitors for dampening power overshoot or droop are generally placed as close as practical to a die load or hot spot in order to increase the capacitors' effectiveness. Often, the decoupling capacitors are surface mounted to the die side or land side of the package upon which the die is mounted. FIG. 1 illustrates a cross-section of an integrated circuit package 102 having die side capacitors 106 and land side capacitors 108 in accordance with the prior art. Die side capacitors 106, as their name implies, are mounted on the same side of the package as the integrated circuit die 104. In contrast, land side capacitors 108 are mounted on the opposite side of the package 102 as the die 104.

FIG. 2 illustrates an electrical circuit that simulates the electrical characteristics of the capacitors illustrated in FIG. 1. The circuit shows a die load 202, which may require capacitance or noise dampening in order to function properly. Some of the capacitance can be supplied by capacitance 204 located on the die. Other capacitance, however, must be provided off chip, as indicated by off-chip capacitor 206. The off-chip capacitor 206 could be, for example, the die side capacitors 106 and/or land side capacitors 108 illustrated in FIG. 1. The off-chip capacitor 206 may more accurately be modeled as a capacitor in series with some resistance and inductance. For ease of illustration, however, off-chip capacitance 206 is modeled as a simple capacitor.

Naturally, the off-chip capacitor 206 would be located some distance, however small, from the die load 202, due to manufacturing constraints. Accordingly, some inductance 208 exists between the die load and the off-chip capacitance. Because the inductance 208 tends to slow the response time of the off-chip capacitor 206, it is desirable to minimize the electrical distance between the off-chip capacitance 206 and the die load 202, thus reducing the inductance value 208. This can be achieved by placing the off-chip capacitor 206 as electrically close as possible to the die load.

Referring back to FIG. 1, die side capacitors 106 are mounted around the perimeter of the die 104, and provide capacitance to various points on the die through traces and vias (not shown) and planes in the package 102. Because die side capacitors 106 are mounted around the perimeter of the die, the path length between a hot spot and a capacitor 106 may result in a relatively high inductance feature between the hot spot and the capacitor 106.

In contrast, land side capacitors 108 can be mounted directly below die 104, and thus directly below some die hot spots. Thus, in some cases, land side capacitors 108 can be placed electrically closer to the die hot spots than can die side capacitors 106, resulting in a lower inductance path to between the die hot spot and the capacitance 108. However, the package also includes connectors (not shown), such as pins or lands, located on its land side. In some cases, placement of land side capacitors 108 on the package's land side would interfere with these connectors. Thus, the use of land side capacitors 108 is not always an acceptable solution to the inductance problem.

Besides the inductance issues described above, additional issues are raised by the industry's trend to continuously reduce device sizes and packing densities. Because of this trend, the amount of package real estate available to surface-mounted capacitors is becoming smaller and smaller.

As electronic devices continue to advance, there is an increasing need for higher levels of capacitance at reduced inductance levels for decoupling, power dampening, and supplying charge. In addition, there is a need for capacitance solutions that do not interfere with package connectors, and which do not limit the industry to certain device sizes and packing densities. Accordingly, there is a need in the art for alternative capacitance solutions in the fabrication and operation of electronic devices and their packages.

DETAILED DESCRIPTION OF THE INVENTION

Various embodiments of the present invention provide an electronic package that includes one or more embedded capacitors. The various embodiments could be implemented in a number of different types of electronic packages, including an integrated circuit package, a printed circuit board or an interposer (i.e., a circuit board that provides a dimensional interface between an integrated circuit package and a printed circuit board). The embodiments of the present invention provide a capacitance solution that effectively suppresses noise, dampens power overshoot and droop, and supplies charge to die hot spots in a timely manner.

In one embodiment, one or more capacitors are embedded within a device package and electrically connected to one or more die loads. The embedded capacitors are integrated circuit capacitors, in one embodiment. In another embodiment, the embedded capacitors are high dielectric ceramic capacitors. Because these capacitors are embedded within the device package, they do not interfere with connections on the package's land side. In addition, the capacitors can be embedded within the package at locations that are very close, electrically, to the various die loads.

Figure 1:
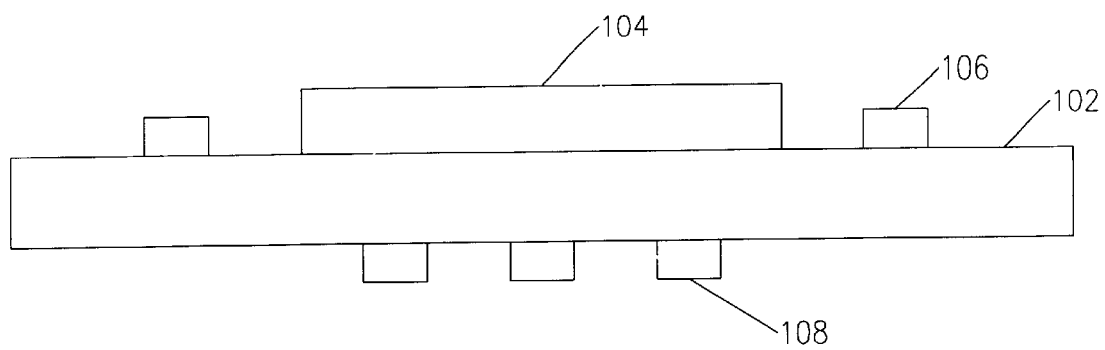
FIG. 1 illustrates a cross-section of an integrated circuit package having die side and land side capacitors in accordance with the prior art.
Figure 2:
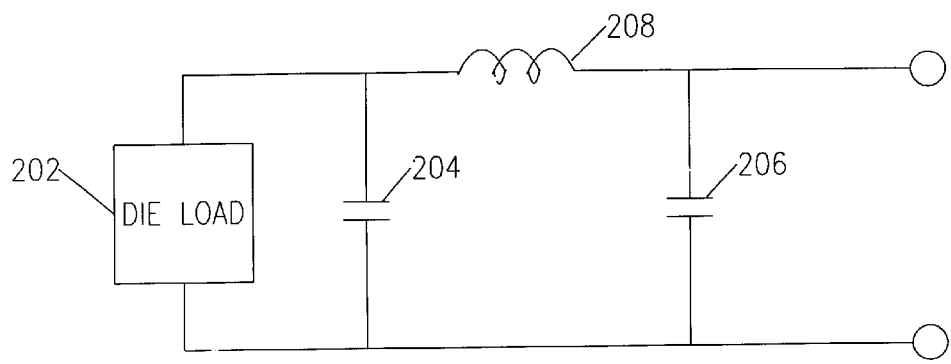
FIG. 2 illustrates an electrical circuit that simulates the electrical characteristics of the capacitors illustrated in FIG. 1.
Figure 3:
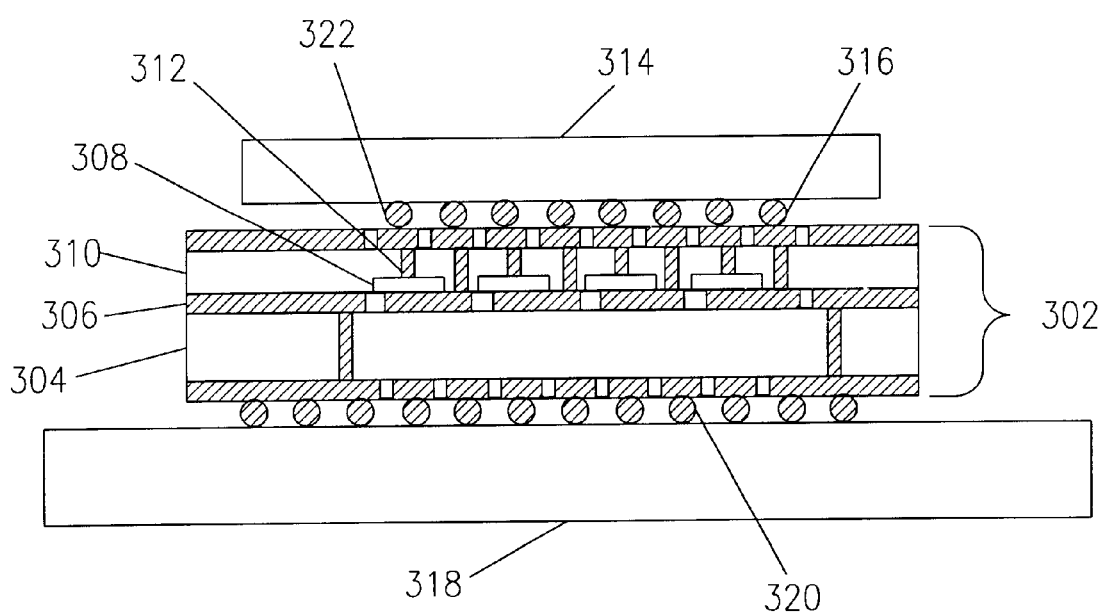
FIG. 3 illustrates a cross-section of an electronic package including a set of embedded capacitors in accordance with one embodiment of the present invention.

FIG. 3 illustrates a cross-section of an electronic package 302 that includes a set of embedded capacitors 308, in accordance with one embodiment of the present invention. Package 302 includes a first layer 304, having a conductive material 306 deposited on its top surface. Mounted on the top surface are one or more embedded capacitors 308. A first terminal (not shown) of each of the one or more capacitors 308 makes electrical contact with the conductive material 306. A nonconductive layer 310 is deposited over the conductive material 306 and the one or more capacitors 308. Connections 312 electrically connect a second terminal (not shown) of each of the one or more capacitors 308 to a top surface of the nonconductive layer 310. The first and second terminals are electrically connected to an integrated circuit 314 through conductive pads 316 on the top surface of the package.

In the embodiment shown, the package is electrically connected to a printed circuit board 318 using solder ball connections 320, and the integrated circuit 314 is electrically connected to the top surface of the package using other solder ball connections 322. In another embodiment, the package could be mounted to the printed circuit board 318 using pins or other connectors. In addition, the integrated circuit 314 could be mounted to the package using wirebond technology or some other mounting technology.

The electronic package 302 shown in FIG. 3 is an integrated circuit package. In other embodiments, the embedded capacitor structure could be used in a printed circuit board and/or an interposer.

Figure 4:
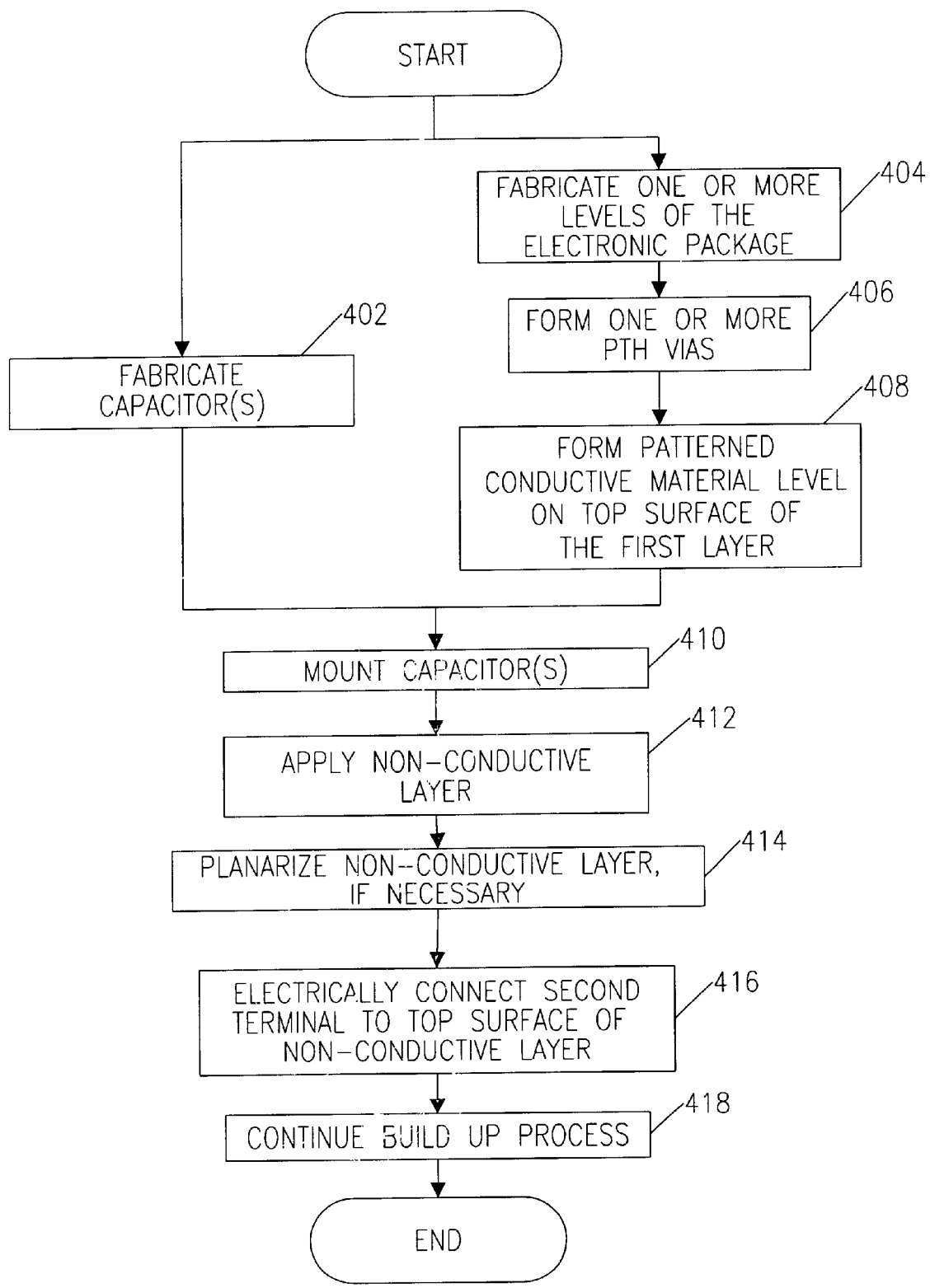
FIG. 4 illustrates a flowchart of a method for fabricating an electronic package including embedded capacitors in accordance with one embodiment of the present invention.

FIG. 4 illustrates a flowchart of a method for fabricating an electronic package that includes embedded capacitors in accordance with one embodiment of the present invention. FIG. 4 should be viewed in conjunction with FIGS. 5–9, which are schematic cross-sections illustrating various stages of fabricating an electronic package including embedded capacitors in accordance with one embodiment of the present invention.

The method begins by performing two separable processes. The first process, represented by block 402, is to fabricate one or more capacitors that will be embedded within the electronic package. In one embodiment, one or more of the embedded capacitors are integrated circuit capacitors or, more specifically, planar chip capacitors on a silicon substrate. A method of making the planar chip capacitors, in accordance with various embodiments of the invention, is described in detail below in conjunction with FIGS. 12–18. In other embodiments, one or more of the embedded capacitors could be ceramic capacitors or other types of discrete capacitors. Methods of making the capacitors in accordance with these other embodiments are well known to those of skill in the art.

The second separable process, represented by blocks 404, 406, and 408, is to fabricate a first layer of the electronic package, which includes a conductive material deposited on its top surface. The term "first layer" is used for descriptive purposes herein, and is meant to include a single package level (e.g., a single conductive or non-conductive level) or multiple package levels formed during a build-up process. Fabricating the first layer includes at least three processes, as described in conjunction with blocks 404–408.

First, one or more levels of the electronic package are formed, in block 404, using package build-up processes well known to those of skill in the art. These processes can include, for example, any combination of photolithography, material deposition, plating, drilling, printing, lamination, and other processes for selectively adding or removing conductive and non-conductive materials.

In one embodiment, the one or more levels of the electronic package includes one or more levels of an organic substrate, such as an epoxy material, and one or more levels of patterned conductive material. If an organic substrate is used, for example, standard printed circuit board materials such as FR-4 epoxy-glass, polymide-glass, benzocyclobutene, Teflon, other epoxy resins, or the like could be used in various embodiments. In alternate embodiments, the package could include an inorganic substance, such as ceramic, for example. In various embodiments, the thickness of the one or more levels is within a range of about 10–1000 microns, where each level is within a range of about 10–40 microns thick in one embodiment. The one or more levels could be thicker or thinner than these ranges in other embodiments.

Fabricating the first layer also includes forming one or more plated through hole (PTH) vias through one or more levels of the first layer, in block 406. Electronic packages commonly include multiple interconnect levels. In such a package, patterned conductive material on one interconnect level is electrically insulated from patterned conductive material on another interconnect level by dielectric material layers. Connections between the conductive material at the various interconnect levels are made by forming openings, referred to as vias, in the insulating layers and providing an electrically conductive structure such that the patterned conductive material from different interconnect levels are brought into electrical contact with each other. Coupled with the electrically conductive structure, the vias are referred to as PTH vias. These structures can extend through one or more of the interconnect levels.

In various embodiments, the diameter of each via is within a range of about 50–300 microns. In addition, the length of each via could be in a range of about 10–1000 microns, depending on how many levels each via extends through. The diameters and lengths of vias could be larger or smaller than these ranges in other embodiments.

Vias could be through holes (i.e., holes through all levels of the first layer), or each via could be bounded above and/or below by various levels of the first layer. A via bounded on only one end is often termed a blind via, and a via bounded on both ends is often termed a buried via.

In one embodiment, vias are mechanically drilled and filled with a conductive material, although vias may also be punched, laser drilled, or formed using other techniques in various other embodiments. If the first layer is an inorganic substance, such as ceramic, other hole formation techniques known to those of skill in the art would be used. For example, the first layer could be created with vias already existing therein.

In one embodiment, some of these PTH vias are used to electrically connect one or both terminals of an embedded capacitor to one or more other layers of the package, as will be described below. In other embodiments, one or both terminals of the embedded capacitor are electrically connected to other layers of the package by forming electrical connections above the capacitor, as will be described below in conjunction with block 416.

Forming the first layer also includes forming a patterned conductive material level on the top surface of the first layer, in block 408. This formation process also could be used to plate or fill the vias, although they could be plated or filled in a separate process as well.

In one embodiment, the conductive material level is a copper layer, although other conductive metals such as tin, lead, nickel, gold, and palladium, or other materials could be used in other embodiments. In various embodiments, the thickness of conductive level is within a range of about 5–15 microns. The conductive level could be thicker or thinner than that range in other embodiments.

In one embodiment, the conductive level is formed using standard techniques for forming a conductive level. In one embodiment, the conductive level is formed by depositing a seed layer, such as sputter-deposited or electroless-deposited copper, on the top surface of the package, followed by electrolytic plating a layer of copper on the seed layer. In another embodiment, the conductive level is formed using standard photolithographic techniques. Other methods of depositing the conductive level will be apparent to those skilled in the art, such as screen printing or other printing of conductive inks. In still another embodiment, rather than using a package layer without a conductive material on its top surface, a clad laminate, such as a copper-clad laminate, could be used.

Figure 5:
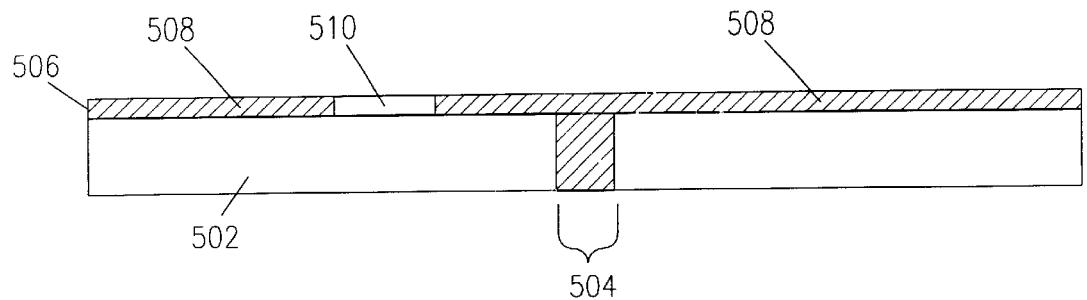
FIGS. 5–9 are schematic cross-sections illustrating various stages of fabricating an electronic package including embedded capacitors in accordance with one embodiment of the present invention.

FIG. 5 illustrates a cross-section of a portion of an electronic package resulting from blocks 404–408, in accordance with one embodiment of the present invention. The portion of the electronic package includes a first non-conductive level 502, PTH via 504, and patterned conductive material level 506. Patterned conductive material level 506 includes conductive portions 508 and non-conductive portions 510. Conductive portions 508 include conductive traces and/or planes of conductive material. In one embodiment, at least a part of conductive portions 508 is electrically connected to PTH via 504. Thus, part of conductive portion 508 makes electrical contact with one or more other levels of the electronic package.

As mentioned previously, first level 502 is a non-conductive material, in one embodiment. In an alternate embodiment, first level 502 could be a conductive material, and PTH via 504 would be structurally modified to have an inner and outer conductor, as is known by those of skill in the art. The outer conductor could be formed by the first conductive level, and the inner conductor and outer conductor would be electrically isolated.

Figure 6:
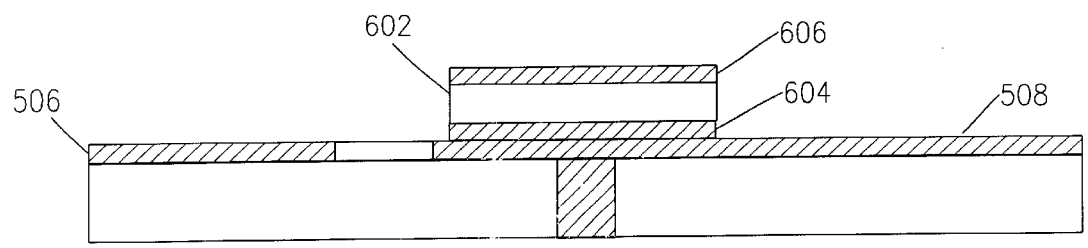

Referring back to FIG. 4, one or more of the capacitors fabricated in block 402 are mounted on the top surface of the first layer in block 410. In various embodiments, the capacitors could be planar chip capacitors, ceramic capacitors, or some other type of discrete capacitor, as described previously. As illustrated in FIG. 6, in one embodiment, each capacitor 602 is mounted so that a first terminal 604 of the capacitor makes electrical contact with a conductive portion 508 of the patterned conductive material level 506.

In one embodiment, the first terminal 604 is located along a bottom surface of capacitor 602, and a second terminal 606 is located along a top surface. In other embodiments, the first or second terminals could be along a side and/or top surface of capacitor 602, and/or capacitor 602 could have multiple contacts that form a single terminal. Most capacitor structures include the equivalent of two conductive surfaces separated by a dielectric, and the term "terminal," as used herein, means one or more contacts on the capacitor package that electrically connect to one of the two conductive surfaces within the interior capacitor structure.

Capacitor 602 is mounted to the top surface of the first layer, in one embodiment, by attaching capacitor 602 to the top surface using a conductive adhesive film or paste (not shown). In other embodiments, where the capacitor's terminal is not along the bottom of the capacitor 602, a non-conductive film or paste could be used. If an adhesive film is used, it is cut and attached to the first layer at locations where the capacitors 602 are to be placed. Similarly, if a paste is used, it is screen printed at the capacitor locations, in one embodiment. Alternatively, the adhesive film or paste could be applied to the capacitor 602 before it is applied to the first layer.

In still other embodiments, the capacitor 602 could be attached to the top surface with one or more solder connections (not shown). Although capacitor 602 is shown to be mounted over a conductive portion of the first layer, capacitor 602 could be mounted over a non-conductive portion of the first layer in an alternate embodiment.

Although only a single capacitor 602 is shown mounted on the first layer, more capacitors (not shown) also could be mounted on the first layer. In addition, as will be described later, one or more capacitors could be mounted to other package layers (not shown) as well.

Figure 7:
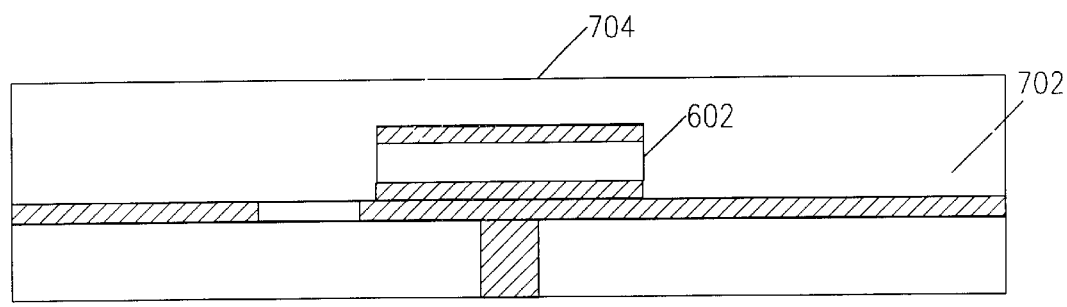

Referring back to FIG. 4, a non-conductive layer of material is applied, in block 412, on the top surface and over the one or more capacitors. FIG. 7 illustrates non-conductive layer 702 applied over the top surface of the first layer and over capacitor 602. In one embodiment, the thickness of non-conductive layer 702 is in a range of about 80–150 microns. Layer 702 could have a thickness outside of this range in other embodiments. Also, in one embodiment, the non-conductive layer has a dielectric constant in a range of 4–5. In other embodiments, the layer could have a larger or smaller dielectric constant.

In one embodiment, a liquid, photoimagable film is screen-printed over the top surface, cured, and photoimaged to form non-conductive layer 702. In another embodiment, non-conductive layer 702 includes one or more sheets of dry film that are vacuum laminated over the top surface and cured. Depending on the thickness of each sheet of non-conductive film, the number of sheets applied over the top surface could be in a range of about 1–20 sheets. In other embodiments, the number of sheets could be larger than this range.

In some cases, application of the non-conductive layer 702 could result in a bump (not shown) in the top surface 704 of the non-conductive layer 702 over the capacitor 602. This condition is less likely when a non-conductive liquid is used to form the non-conductive layer 702, since a sufficiently viscous liquid is self-planarizing.

Referring back to FIG. 4, the top surface 704 of the non-conductive layer 702 is planarized, in block 414, if necessary. Planarization could be performed, for example, by pressing, mechanically grinding, and/or polishing the top surface until it is sufficiently smooth.

Figure 8:
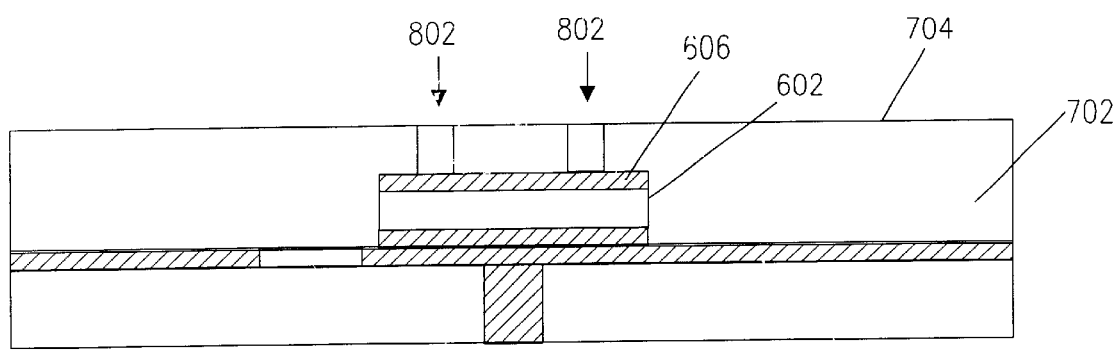

In block 416, the second terminal 606 of the capacitor 602 is electrically connected to the top surface 704 of the non-conductive layer 702. In one embodiment, as illustrated in FIG. 8, this is done by forming one or more contact holes 802 through the top surface 704 and extending to the second terminal 606. Forming contact holes 802 could be done, for example, by mechanically or laser drilling contact holes 802 or using a photolithography process. In alternate embodiments, terminals 606 could be formed using other techniques, such as laser ablation, imprinting, perforation, or other less-common or developing techniques. In one embodiment, contact holes 802 have a diameter in a range of about 50–300 microns. Larger or smaller diameter contact holes 802 could be used in other embodiments.

In one embodiment, the second terminal is located on the top of capacitor 602, and thus contact holes 802 would form openings to the top of capacitor 602. In other embodiments, the second terminal could be located on or towards the sides and/or bottom of capacitor 602, and contact holes 802 would be located accordingly.

Figure 9:
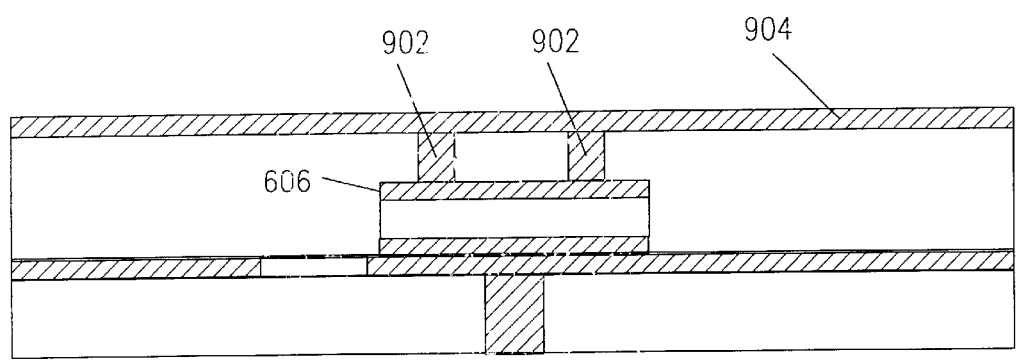

In order to electrically connect the second terminal to the top surface 704, additional conductive material is deposited into contact holes 802. As illustrated in FIG. 9, the conductive material 902 within the contact holes is electrically connected to an additional layer of patterned conductive material 904. This facilitates the electrical connection of the second terminal 606 to the top surface and beyond.

Referring back to FIG. 4, the build up process continues, if appropriate, in block 418. Thus, using techniques known to those of skill in the art, one or more additional package layers (not shown) of conductive and non-conductive materials can be deposited over conductive material layer 904. The number of additional layers, if any, that are built up depends on the package design. During the build up process, the first and second terminals of the capacitor continue to be electrically connected to the top surface of the package.

In one embodiment, part of the build up process includes mounting, embedding, and electrically connecting one or more additional capacitors within one or more additional layers of the package. Thus, embedded capacitors could be located within one or more layers of the package. After the build up process is completed, the method ends.

Figure 10:
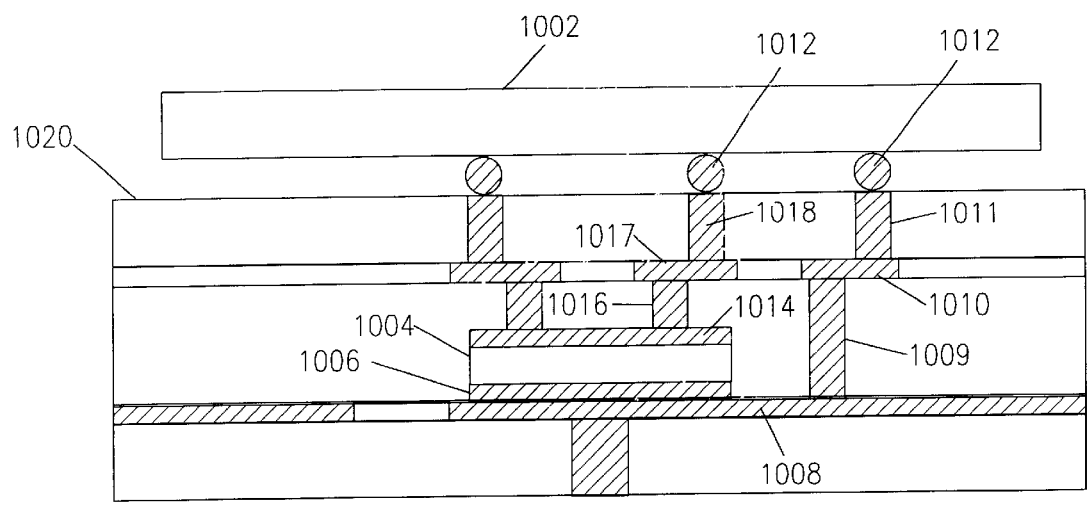
FIG. 10 illustrates a cross-section of an electronic package including an embedded capacitor in accordance with one embodiment of the present invention.

FIG. 10 illustrates a cross-section of an electronic package including an embedded capacitor in accordance with one embodiment of the present invention. In the embodiment shown, the package is an integrated circuit package, upon which an integrated circuit 1002 is mounted.

One or more loads (not shown) within integrated circuit 1002 are electrically connected to embedded capacitor 1004. The first terminal 1006 of capacitor 1004 is connected to the load(s) via electrical connections 1008, 1009, 1010, 1011, and solder bump 1012. The second terminal 1014 is connected to the load via electrical connections 1016, 1017, 1018, and solder bump 1012.

In addition, during operation, the first terminal 1006 is coupled to a first potential source, and the second terminal 1014 is coupled to a second potential source. For example, the first and second potential sources can be a ground potential and a supply potential, Vcc. Which terminal is coupled to which potential source is a matter of design, as either set can be connected to either source.

As shown in FIG. 10, electrical connections 1008–1011 and 1016–1018 can be formed by one or more vias and/or conductive traces. FIG. 10 is for illustrative purposes only, and numerous different configurations for electrically connecting the terminals 1006, 1014 of capacitor 1004 to the top surface 1020 of the package could be used. In particular, the number of package layers between the capacitor 1004 and the top surface 1020 could be different, the location of the capacitor's terminals could be different, and the locations and numbers of the constituent parts of electrical connections 1008–1011 and 1016–1018 could be different than shown.

In one embodiment, at least some of the embedded capacitors 1004 are disposed underneath the integrated circuit 1002. The embedded capacitors 1004 may be dispersed evenly underneath the integrated circuit 1002, or concentrations of embedded capacitors 1004 could be provided to produce additional capacitance for the die hot spots. Although only a single capacitor 1004 is illustrated in FIG. 10, in practice, many more embedded capacitors could be dispersed underneath the integrated circuit 1002 in order to provide sufficient capacitance. In alternate embodiments, some or all of the embedded capacitors 1004 are located in areas of the package that are not underneath integrated circuit 1002.

Figure 11:
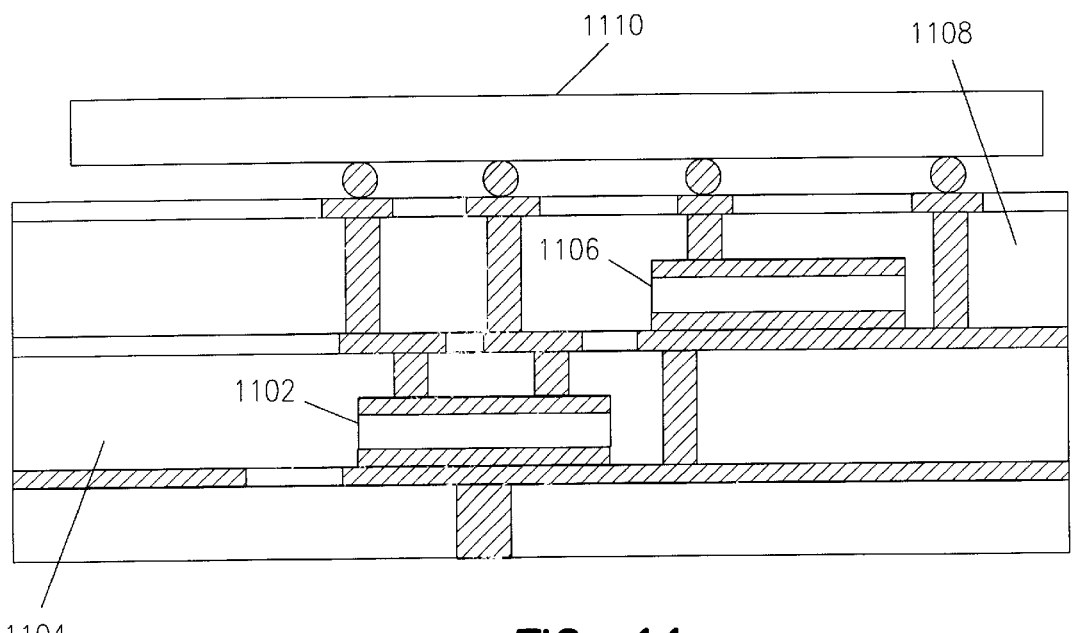
FIG. 11 illustrates a cross-section of an electronic package including a set of embedded capacitors in accordance with another embodiment of the present invention.

As mentioned previously, capacitors could be embedded within multiple different layers of a package, in various embodiments. FIG. 11 illustrates a cross-section of an electronic package including a set of embedded capacitors in accordance with another embodiment of the present invention. Capacitor 1102 is embedded within a first layer 1104 of the package, and capacitor 1106 is embedded within a second layer 1008 of the package. Electrical connections are made between the capacitors' terminals and the top surface of the package, to which an integrated circuit 1110 is electrically connected.

Implementation of the embedded capacitor structure in an integrated circuit package is just one embodiment of the present invention. In another embodiment, the embedded capacitor structure is implemented in a printed circuit board. In that embodiment, a socket, pads or some other connectors are located on the top surface of the package and interconnected to the embedded capacitors. In still another embodiment, the embedded capacitor structure is implemented in an interposer. When used in an interposer, the top surface of the package also includes a socket, pads or some other connectors that are electrically coupled to the embedded capacitors.

As described previously, various types of capacitors can be embedded within an electronic package in various embodiments. In one embodiment, an "integrated circuit capacitor," is used. The integrated circuit capacitor can be formed on a silicon substrate or some other type of substrate, in various embodiments.

As mentioned previously, many capacitor structures include the equivalent of two conductive surfaces separated by a dielectric. In one embodiment, the integrated circuit capacitor includes two or more electrodes and N−1 thin film dielectric layers, where N is the number of electrodes present. Thus, in the embodiment described below having two electrodes, a single thin film dielectric layer is used.

Figure 12:
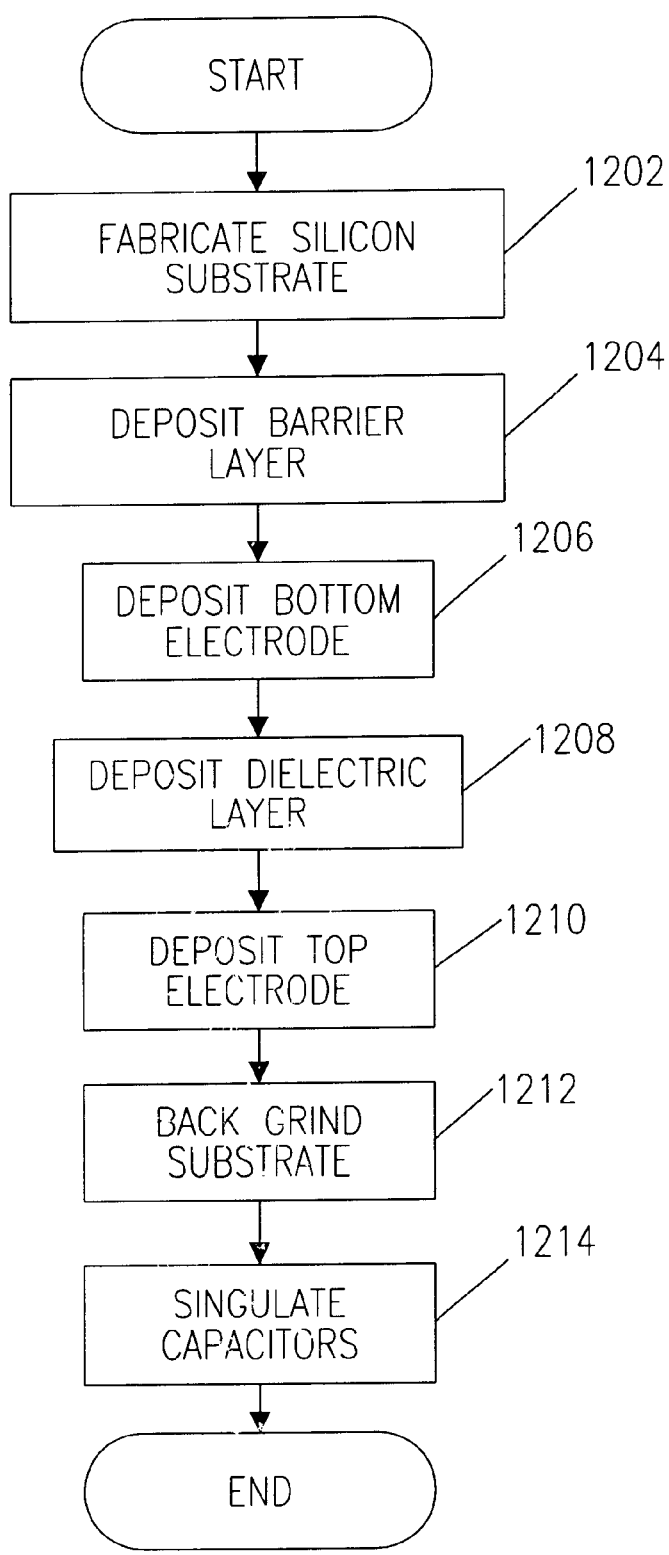
FIG. 12 illustrates a flowchart of a method for fabricating an integrated circuit capacitor in accordance with one embodiment of the present invention.

FIG. 12 corresponds to block 402 (FIG. 4), and illustrates a flowchart of a method for fabricating an integrated circuit capacitor in accordance with one embodiment of the present invention. FIG. 12 should be viewed in conjunction with FIGS. 13–17, which are schematic cross-sections illustrating various stages of fabricating an integrated circuit capacitor in accordance with one embodiment of the present invention.

Figure 13:
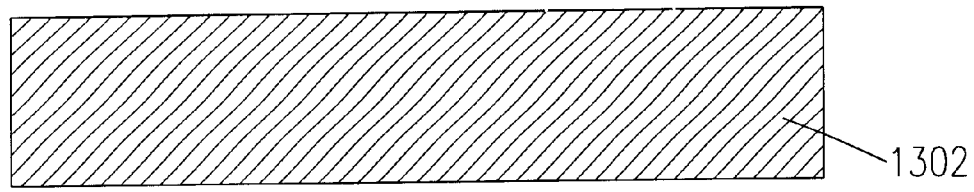
FIGS. 13–17 are schematic cross-sections illustrating various stages of fabricating an integrated circuit capacitor in accordance with one embodiment of the present invention.

The method begins, in block 1202, by fabricating a silicon substrate. FIG. 13 illustrates a cross-section of a portion of a silicon substrate 1302 in accordance with one embodiment of the present invention. In other embodiments, substrates composed of materials other than silicon can be used.

In one embodiment, silicon substrate 1302 is a highly doped, n+ silicon wafer having a resistivity of less than 0.1 Ohms/centimeter. As such, silicon substrate 1302 is conductive and forms a portion of a bottom terminal of a silicon chip capacitor. In an alternate embodiment, an n or p type silicon wafer could be used having a resistivity of less than 50 Ohms/centimeter. In another alternate embodiment, the silicon substrate 1302 is not used as part of the bottom terminal. Instead, connectivity to the electrode (described in conjunction with blocks 1204 and 1206) is provided through vias. In such an embodiment, the resistivity of the substrate 1302 is not as important.

Figure 14:
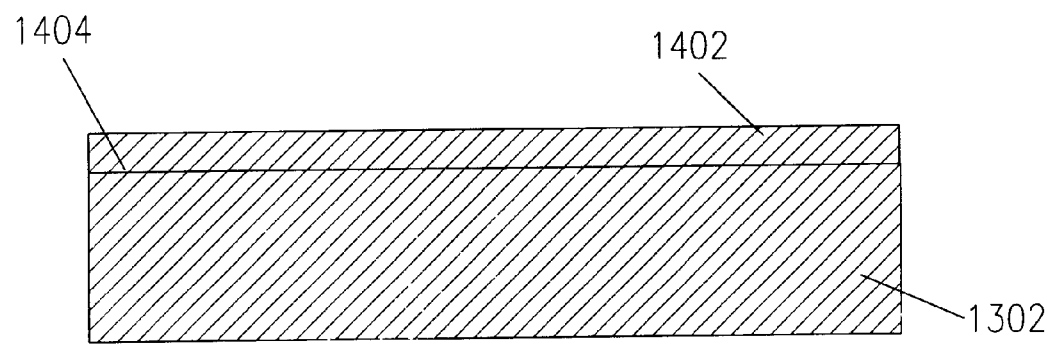

Another portion of the bottom terminal is formed by depositing a barrier layer, in block 1204, on the silicon substrate. FIG. 14 illustrates barrier layer 1402 deposited on the top surface 1404 of silicon substrate 1302.

In one embodiment, the barrier layer is made of a highly doped, conductive substrate material having a low sheet resistivity. For example, materials such as titanium or titanium nitride could be used. The barrier layer is deposited on the silicon substrate using deposition techniques well known to those of skill in the art. In one embodiment, barrier layer 1402 has a thickness in a range of about 100–1000 Angstroms. A layer having a thickness that is greater or smaller than the above range can be used in other embodiments.

Figure 15:
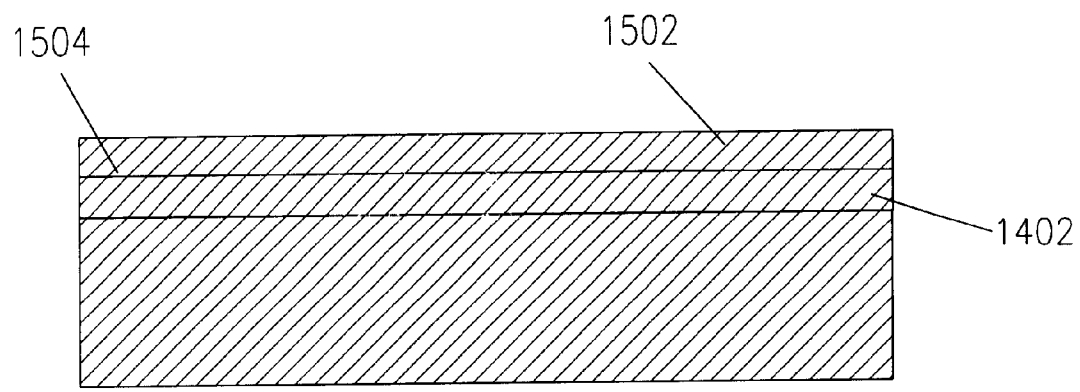

Referring back to FIG. 12, a bottom electrode is deposited on the barrier layer, in block 1206, using deposition techniques well known to those of skill in the art. FIG. 15 illustrates bottom electrode 1502 deposited on the top surface 1504 of barrier layer 1402, in accordance with one embodiment of the present invention.

Bottom electrode 1502 completes a bottom terminal of the silicon chip capacitor. In one embodiment, the bottom electrode is made of a material that is compatible with the capacitor's dielectric layer (described below). For example, materials such as platinum, palladium, tungsten, or AlSiCu could be used. In other embodiments, other conductive materials could be used. In one embodiment, bottom electrode 1502 has a thickness in a range of about 1–10 microns. An electrode having a thickness that is greater or smaller than the above range can be used in other embodiments.

Figure 16:
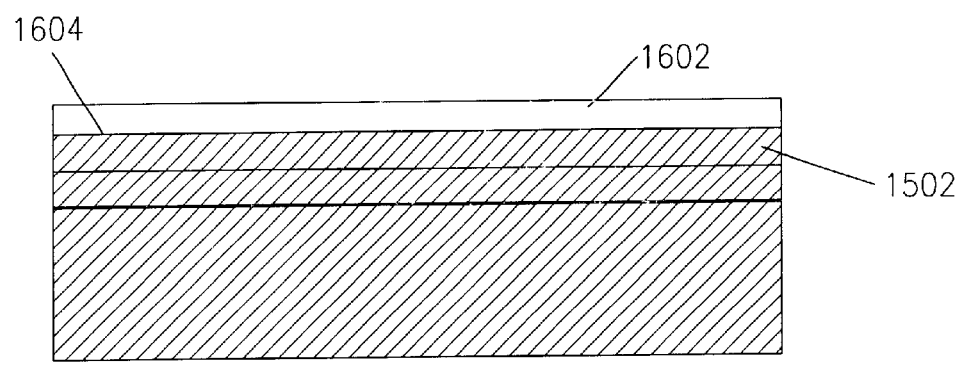

Next, in block 1208, a dielectric layer is deposited on the bottom electrode. FIG. 16 illustrates dielectric layer 1602 deposited on the top surface 1604 of the bottom electrode 1502, in accordance with one embodiment of the present invention.

In one embodiment, the dielectric layer is a high-dielectric ferroelectric in the perovskite structure, such as $SrTiO_3$, $BaTiO_3$, $Pb(Zr)TiO_3$, or other high dielectric constant materials, such as $Ta_2O_5$. The dielectric layer is deposited on the bottom electrode using deposition techniques well known to those of skill in the art. In one embodiment, dielectric layer has a thickness in a range of about 100–1000 Angstroms. A layer having a thickness that is greater or smaller than the above range can be used in other embodiments.

In one embodiment, dielectric layer 1602 has a relatively high dielectric constant (e.g., in a range of about 2000 to 5000 or more). In this manner, the capacitor provides a relatively large amount of charge, when needed. In alternate embodiments, dielectric layer 1602 could have a dielectric constant that is higher or lower than the above range.

Figure 17:
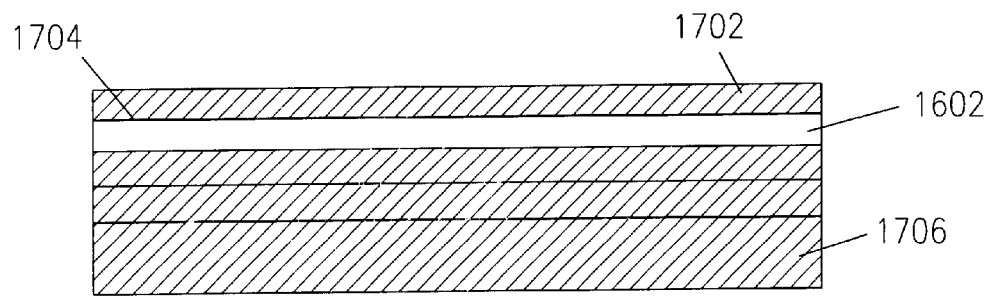

Referring again to FIG. 12, a top electrode is deposited on the dielectric layer in block 1210. FIG. 17 illustrates top electrode 1702 deposited on the top surface 1704 of dielectric layer 1602, in accordance with one embodiment of the present invention.

In one embodiment, the top electrode 1702 is made of the same material using the same deposition techniques as described in conjunction with depositing the bottom electrode, in block 1206. In addition, the top electrode 1702 has about the same thickness as the bottom electrode. In other embodiments, the material, deposition technique, and/or electrode thickness can be different for the top and bottom electrodes.

After depositing the top electrode 1702, the capacitor structure is complete. Next, in one embodiment, the bottom surface of the silicon substrate is back grinded, in block 1212. This is done in order to reduce the thickness of the substrate, as illustrated by a thinner silicon substrate 1706 in FIG. 17. Back grinding is performed, in one embodiment, by mechanically grinding or polishing the bottom surface of the silicon substrate.

Finally, in block 1214, multiple capacitors are singulated by dicing the structure into pieces. Singulating the capacitors is performed, in one embodiment, by laser or mechanical sawing. Other singulation techniques well known to those of skill in the art can be used in other embodiments. In an alternate embodiment, a "dice before grind" process could be used, where the process of singulating the capacitors (block 1214) occurs before back grinding (block 1212).

Each of the singulated capacitors has a thickness in a range of about 30–150 microns, and a depth and width in a range of about 5–10 millimeters, in one embodiment. In other embodiments, the dimensions of each capacitor can be larger or smaller than the above ranges. After singulating the capacitors, the method ends.

FIG. 17 illustrates a simple capacitive structure having a first terminal (formed from the bottom electrode, the barrier layer, and the silicon substrate), a dielectric layer, and a top electrode that forms the second terminal. As will be obvious to one of skill in the art based on the description herein, the capacitive structure can be modified into various configurations while still achieving the same purpose. For example, FIG. 18 illustrates a cross-section of an integrated circuit capacitor in accordance with another embodiment of the present invention.

Figure 18:
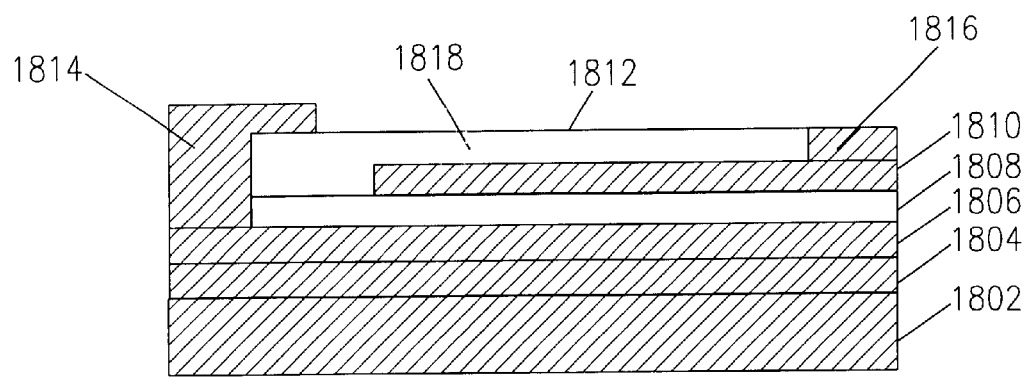
FIG. 18 illustrates a cross-section of an integrated circuit capacitor in accordance with another embodiment of the present invention.

The capacitor shown in FIG. 18 also includes a thinned silicon substrate 1802, a barrier layer 1804, a bottom electrode 1806, a dielectric layer 1808, and a top electrode 1810. Unlike the capacitor of FIG. 17, however, both electrodes 1806, 1810 of the capacitor of FIG. 18 are electrically connected to the top surface 1812 of the capacitor. The top connections are made, in one embodiment, using connectors 1814 and 1816 to electrically connect the bottom and top electrodes 1806, 1810, respectively, to the top surface 1812. In addition, an additional dielectric layer 1818 is used to electrically isolate connectors 1814 and 1816.

Although many of the same deposition, back grinding, and singulation techniques can be used to fabricate the capacitor of FIG. 18, additional steps are also necessary to form and isolate connectors 1814 and 1816. For example, after the top electrode 1810 is formed, portions of the top electrode are selectively removed, and an additional dielectric layer 1818 is deposited on the top surface of the top electrode 1810.

Then, portions of dielectric layers 1818 and 1808 are selectively removed to expose portions of the top and bottom electrodes 1810, 1806. Standard silicon via or plug processing techniques are then employed, in one embodiment, to form connectors 1814 and 1816. Other techniques well known to those of skill in the art also could be employed in other embodiments.

The capacitor shown in FIG. 18 is a single-layer capacitor. In other embodiments, portions of the build up process could be repeated in order to form a multi-layer capacitor. In such embodiments, additional conductive and non-conductive layers would be built up on the top surface 1812 of dielectric layer 1818, essentially forming multiple capacitors that are capable of holding a greater amount of charge.

Figure 19:
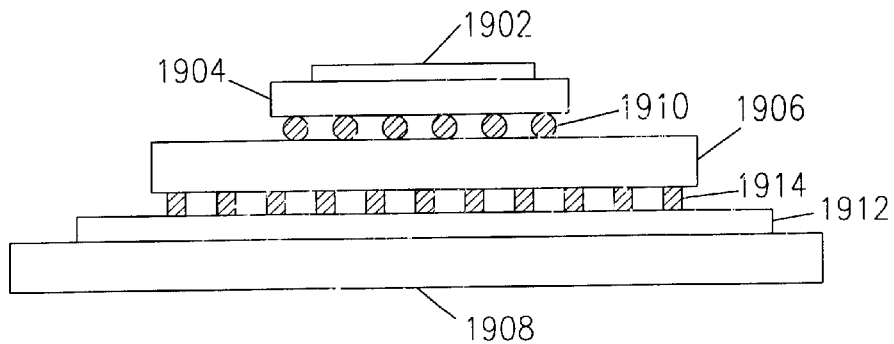
FIG. 19 illustrates an integrated circuit package, interposer, and printed circuit board, each of which could include one or more embedded capacitors in accordance with various embodiments of the present invention.

As described previously, one or more of the capacitors illustrated in FIGS. 17 and 18, or other appropriate substitutes, are embedded within an integrated circuit package, interposer, and/or printed circuit board. FIG. 19 illustrates an integrated circuit package 1904, interposer 1906, and printed circuit board 1908, each of which could include one or more embedded capacitors in accordance with various embodiments of the present invention.

Starting from the top of FIG. 19, an integrated circuit 1902 is housed by integrated circuit package 1904. Integrated circuit 1902 contains one or more circuits which are electrically connected to integrated circuit package 1904 by connectors (not shown).

Integrated circuit 1902 could be any of a number of types of integrated circuits. In one embodiment of the present invention, integrated circuit 1902 is an microprocessor, although integrated circuit 1902 could be other types of devices in other embodiments. In the example shown, integrated circuit 1902 is a "flip chip" type of integrated circuit, meaning that the input/output terminations on the chip can occur at any point on its surface. After the chip has been readied for attachment to integrated circuit package 1904, it is flipped over and attached, via solder bumps or balls to matching pads on the top surface of integrated circuit package 1904. Alternatively, integrated circuit 1902 could be wire bonded, where input/output terminations are connected to integrated circuit package 1904 using bond wires to pads on the top surface of integrated circuit package 1904.

One or more of the circuits within integrated circuit 1902 acts as a load, which may require capacitance, noise suppression, and/or power dampening. Some of this capacitance is provided, in one embodiment of the present invention, by capacitors (not shown) embedded within integrated circuit package 1904.

In this manner, one or more levels of additional capacitance are provided to integrated circuit 1902, also providing power dampening and noise suppression, when needed. The close proximity of these off-chip sources of capacitance means that each source has a relatively low inductance path to the die. In other embodiments, the capacitors are embedded within the printed circuit board 1908, interposer 1906, or some combination thereof.

Integrated circuit package 1904 is coupled to interposer 1906 using solder connections, such as ball grid array connections 1910, for example. In another embodiment, integrated circuit package 1904 could be electrically and physically connected to interposer 1906 using a pinned connection, as described below.

Interposer 1906 is coupled to printed circuit board 1908 through a socket 1912 on printed circuit board 1908. In the example shown, interposer 1906 includes pins 1914, which mate with complementary pin holes in socket 1912. Alternatively, interposer 1906 could be electrically and physically connected to printed circuit board 1908 using solder connections, such as ball grid array connections, for example. In still another alternate embodiment, integrated circuit package 1904 could be connected directly to printed circuit board 1908, without using an interposer. In such an embodiment, integrated circuit package 1904 and printed circuit board 1908 could be electrically and physically connected using ball grid array or pinned connections. Other ways of connecting integrated circuit package 1904 and printed circuit board 1908 could also be used in other embodiments.

Printed circuit board 1908 could be, for example, a motherboard of a computer system. As such, it acts as a vehicle to supply power, ground, and other types of signals to integrated circuit 1902. These power, ground, and other signals are supplied through traces or planes (not shown) on or within printed circuit board 1908, socket 1912, pins 1914, and traces (not shown) on or within interposer 1906 and integrated circuit package 1904.

Figure 20:
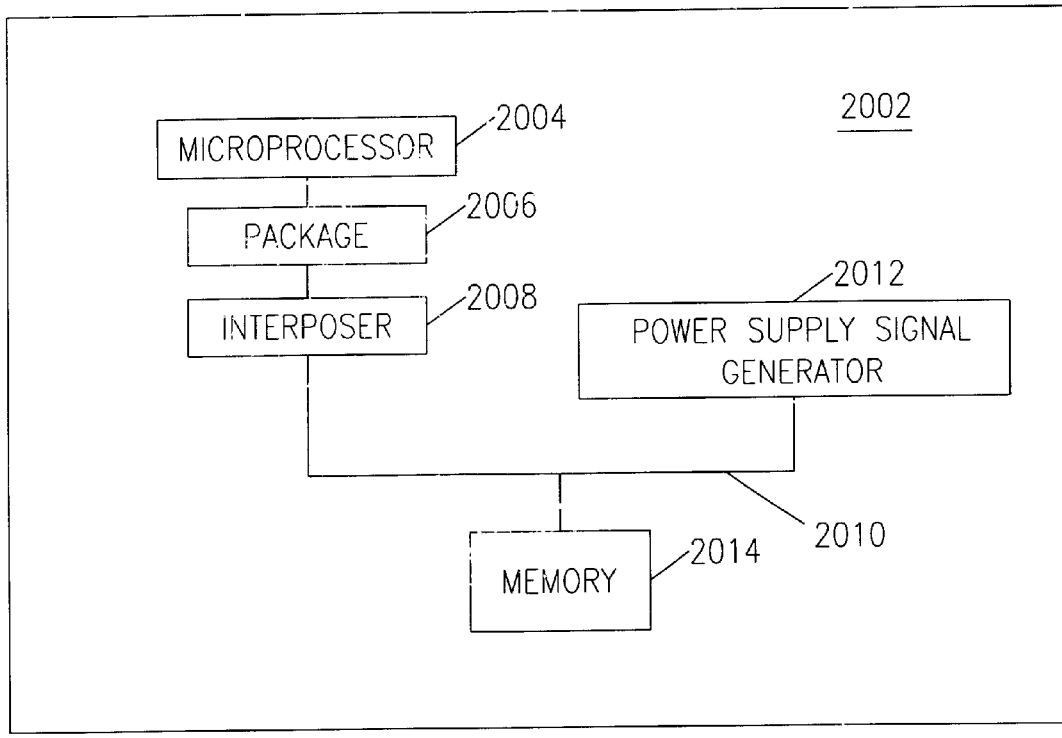
FIG. 20 illustrates a general purpose computer system in accordance with one embodiment of the present invention.

The package described above in conjunction with various embodiments could be a integrated circuit package, interposer, or printed circuit board forming part of a general purpose computer system. FIG. 20 illustrates a general purpose computer system in accordance with one embodiment of the present invention.

The computer system is housed on printed circuit board 2002, and includes microprocessor 2004, integrated circuit package 2006, interposer 2008, bus 2010, power supply signal generator 2012, and memory 2014. Integrated circuit package 2006, interposer 2008, and/or printed circuit board 2002 include one or more embedded capacitors in accordance with various embodiments of the present invention, described above. Integrated circuit package 2006 and interposer 2008 couple microprocessor 2004 to bus 2010 in order to deliver power and communication signals between microprocessor 2004 and devices coupled to bus 2010. For the embodiment of the present invention shown in FIG. 20, bus 2010 couples microprocessor 2004 to memory 2014 and power supply signal generator 2012. However, it is to be understood that in alternative embodiments of the present invention, microprocessor 2004 can be coupled to memory 2014 and power supply signal generator 2012 through two different busses.

CONCLUSION

Thus, various embodiments of an electronic package having one or more embedded capacitors and methods of fabricating that package have been described, along with a description of the incorporation of a package within a general purpose computer system. In addition, various embodiments relating to the fabrication of the package and capacitor have also been described.

While the foregoing examples of dimensions and ranges are considered typical, the various embodiments of the invention are not limited to such dimensions or ranges. It is recognized that the trend within industry is to generally reduce device dimensions for the associated cost and performance benefits.

In the foregoing detailed description of the preferred embodiments, reference is made to the accompanying drawings which form a part hereof, and in which are shown by way of illustration specific preferred embodiments in which the invention may be practiced. These embodiments are described in sufficient detail to enable those skilled in the art to practice the invention.

It will be appreciated by those of ordinary skill in the art that any arrangement which is calculated to achieve the same purpose may be substituted for the specific embodiment shown.

For example, illustrative embodiments show capacitors embedded within certain layers of a package. However, those skilled in the art will recognize that the embedded capacitors could be included in one or more other layers, in accordance with the present invention. Also, besides having application in an integrated circuit package, the embedded capacitors can be used in place of various discrete components on an interposer or printed circuit board, in other embodiments. In addition, additional layers of patterned conductive materials and interconnects for carrying signals, power, and ground may exist between, above, or below the layers shown in the figures.

The various embodiments have been described in the context of providing excess, off-chip capacitance to a die. One of ordinary skill in the art would understand, based on the description herein, that the method and apparatus of the present invention could also be applied in many other applications where an embedded capacitor having a low inductance path to a circuit load are desired. Therefore, all such applications are intended to fall within the spirit and scope of the present invention.

This application is intended to cover any adaptations or variations of the present invention. The foregoing detailed description is, therefore, not to be taken in a limiting sense, and it will be readily understood by those skilled in the art that various other changes in the details, materials, and arrangements of the parts and steps which have been described and illustrated in order to explain the nature of this invention may be made without departing from the spirit and scope of the invention as expressed in the adjoining claims.

What is claimed is:

1. An electronic package comprising:
    a first layer of the electronic package having a top surface;
    at least one discrete capacitor mounted on the top surface, wherein each of the at least one discrete capacitor has a first terminal and a second terminal;
    a non-conductive layer applied on the top surface and over the at least one discrete capacitor; and
    electrical connections between the first terminal and the second terminal of the at least one discrete capacitor and a top surface of the non-conductive layer.

2. The electronic package as claimed in claim 1, wherein the electronic package is an integrated circuit package that is electrically connectable to an integrated circuit.

3. The electronic package as claimed in claim 1, wherein the electronic package is an interposer that is electrically connectable to an integrated circuit package.

4. The electronic package as claimed in claim 1, wherein the electronic package is a printed circuit board that is electrically connectable to an integrated circuit package.

5. The electronic package as claimed in claim 1, wherein each of the at least one capacitor comprises:
    a bottom electrode, which forms at least a part of the first terminal;
    a dielectric layer connected to the bottom electrode; and
    a top electrode, connected to the dielectric layer, which forms at least a part of the second terminal, wherein the bottom electrode is formed on a silicon substrate.

6. The electronic package as claimed in claim 1, further comprising:
    one or more additional capacitors mounted on one or more additional layers of the electronic package.

7. A computer system positioned on a printed circuit board, the computer system comprising:
    a bus;
    a memory coupled to the bus; and
    an integrated circuit package coupled to the bus, including:
        an electronic package having a first layer with a top surface, at least one capacitor mounted on the top surface, wherein the capacitor has a first terminal and a second terminal, a non-conductive layer applied on the top surface and over the at least one capacitor, and electrical connections between the first terminal and the second terminal of the at least one capacitor and a top surface of the non-conductive layer, and
        a microprocessor located on a top surface of the electronic package, the microprocessor containing a circuit that is electrically connected to the first terminal and the second terminal.

8. The computer system as claimed in claim 7, further comprising:
    one or more additional capacitors mounted on one or more additional layers of the electronic package.

9. The computer system as claimed in claim 7, wherein each of the one or more capacitors comprises:
    a bottom electrode that forms at least a part of the first terminal;
    a dielectric layer connected to the bottom electrode; and
    a top electrode, connected to the dielectric layer, that forms at least a part of the second terminal, wherein the bottom electrode is formed on a silicon substrate.

10. A method for fabricating an electronic package, the method comprising:
    mounting a discrete capacitor on a top surface of a first layer of the electronic package, wherein the discrete capacitor has a first terminal and a second terminal;
    applying a non-conductive layer on the top surface and over the discrete capacitor; and
    electrically connecting the first terminal and the second terminal of the discrete capacitor to a top surface of the non-conductive layer.

11. The method as claimed in claim 1, further comprising:
    mounting one or more additional capacitors on the top surface of the first layer.

12. The method as claimed in claim 10, further comprising:
    mounting one or more additional capacitors on one or more other layers of the electronic package.

13. The method as claimed in claim 10, wherein mounting the capacitor comprises:
    attaching the capacitor to the top surface with an adhesive film.

14. The method as claimed in claim 10, wherein mounting the capacitor comprises:

attaching the capacitor to the top surface with one or more solder connections.

15. The method as claimed in claim 10, wherein applying the non-conductive layer comprises:

laminating one or more sheets of non-conductive film on the top surface; and curing the one or more sheets of non-conductive film.

16. The method as claimed in claim 15, further comprising:

planarizing the one or more sheets of non-conductive film.

17. The method as claimed in claim 1, wherein applying the non-conductive layer comprises:

screen-printing a photoimagable liquid on the top surface;

curing the photoimagable liquid; and photoimaging the photoimagable liquid.

18. The method as claimed in claim 1, wherein applying the non-conductive layer comprises:

applying a non-conductive layer having a thickness in a range of about 80 to 150 microns.

19. The method as claimed in claim 1, wherein electrically connecting the second terminal comprises:

forming contact holes through the top surface of the non-conductive layer to the second terminal; and depositing additional conductive material in the contact holes.

20. The method as claimed in claim 1, further comprising:

building up one or more additional package layers on the top surface of the electronic package; and electrically connecting the first terminal and the second terminal to a top surface of the one or more additional package layers.

21. A method for fabricating an electronic package, the method comprising:

mounting a capacitor on a top surface of a first layer of the electronic package, wherein the capacitor has a first terminal and a second terminal, and wherein the capacitor includes a bottom electrode that forms at least a part of the first terminal, a dielectric layer, and a top electrode that forms at least a part of the second terminal, wherein the bottom electrode is formed on a silicon substrate;

applying a non-conductive layer on the top surface and over the capacitor; and electrically connecting the first terminal and the second terminal of the capacitor to a top surface of the non-conductive layer.

22. The method as claimed in claim 21, further comprising:

depositing a barrier layer on a silicon substrate;

depositing the bottom electrode on a top surface of the barrier layer;

depositing a dielectric layer on a top surface of the bottom electrode; and depositing the top electrode on a top surface of the dielectric layer.

23. The method as claimed in claim 22, further comprising:

singulating the capacitor by separating the capacitor from multiple other capacitors deposited on the silicon substrate.

24. The method as claimed in claim 22, further comprising:

back grinding the silicon substrate to reduce a thickness of the silicon substrate.

25. The method as claimed in claim 22, wherein depositing the barrier layer comprises:

depositing a barrier layer having a thickness in a range of about 100 to 1000 Angstroms.

26. The method as claimed in claim 22, wherein depositing the barrier layer comprises:

depositing a barrier layer of a highly doped, conductive substrate material.

27. The method as claimed in claim 22, wherein depositing the bottom electrode comprises:

depositing a bottom electrode having a thickness in a range of about 1 to 10 microns.

28. The method as claimed in claim 22, wherein depositing the dielectric layer comprises:

depositing a dielectric layer having a thickness in a range of about 100 to 1000 Angstroms.

29. The method as claimed in claim 22, wherein depositing the top electrode comprises:

depositing a top electrode having a thickness in a range of about 1 to 10 microns.

* * * * *

UNITED STATES PATENT AND TRADEMARK OFFICE
CERTIFICATE OF CORRECTION

PATENT NO.   : 6,407,929 B1                                                      Page 1 of 1
DATED        : June 18, 2002
INVENTOR(S)  : Aaron Dean Hale, Michael Walk, David G. Figueroa, Joan K. Vrtis and
               Toshimi Kohmura It is certified that error appears in the above-identified patent and that said Letters Patent is hereby corrected as shown below:

Column 14,
Line 54, delete "claim 1" and insert -- claim 10 --, therefor.

Column 15,
Lines 13, 18, 23 and 29, delete "claim 1" and insert -- claim 10 --, therefor.

Signed and Sealed this

Tenth Day of December, 2002

JAMES E. ROGAN
*Director of the United States Patent and Trademark Office*